(12) United States Patent
Miaille et al.

(10) Patent No.: US 7,579,908 B2
(45) Date of Patent: Aug. 25, 2009

(54) DIGITAL AUDIO AMPLIFIERS, ELECTRONIC SYSTEMS, AND METHODS

(75) Inventors: Gerald P. Miaille, Chandler, AZ (US); Julian Aschieri, Tempe, AZ (US); Zhou Zhixu, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 51 days.

(21) Appl. No.: 11/845,035

(22) Filed: Aug. 25, 2007

(65) Prior Publication Data

US 2009/0051423 A1 Feb. 26, 2009

(51) Int. Cl.
*H03F 3/38* (2006.01)
(52) U.S. Cl. .......................... 330/10; 330/251
(58) Field of Classification Search ................ 330/10, 330/207 A, 251
See application file for complete search history.

(56) References Cited

U.S. PATENT DOCUMENTS

| 6,362,683 | B1 * | 3/2002 | Miao et al. ............... 330/10 |
| 6,768,376 | B2 | 7/2004 | Hoyt et al. |
| 6,922,100 | B2 | 7/2005 | Midya et al. |
| 7,170,340 | B1 * | 1/2007 | Bhatt et al. ............... 330/10 |
| 2005/0058209 | A1 | 3/2005 | Magrath |
| 2008/0042746 | A1 * | 2/2008 | Kozak et al. ............. 330/251 |

FOREIGN PATENT DOCUMENTS

| GB | 2388724 | 11/2003 |
| GB | 2425668 | 11/2006 |
| WO | 9728600 | 8/1997 |

OTHER PUBLICATIONS

Phillips, K., et al., PowerDAC: A single-chip audio DAC with a 70%-Efficient Power Stage in a 0.5um CMOS, 1999 IEEE Internationla Solid-State Circuits Conference, Jun. 1999.
Midya, Pallub, et al., Digital Correction of PWM Switching Amplifiers, IEEE Power Electronics Letters, vol. 2, No. 2, Jun. 2004.
Biswas, B.R. 1-Bit Amplifiaction for Excellent Sound Reproduction, Electronic For You, Feb. 2004.
Magrath, A., Design and Evaluation of a High Performance Class D Headphone Driver, Audio Engineering Society, Convention Paper 6907, Oct. 5-8, 2006.
Wolfson Microelectronics, Class D Basics, Sep. 2006, Rev. 1.0.

* cited by examiner

*Primary Examiner*—Khanh V Nguyen
(74) *Attorney, Agent, or Firm*—Ingrassia, Fisher & Lorenz, P.C.

(57) ABSTRACT

An embodiment of an electronic system includes a digital audio amplifier having a continuous time modulator adapted to generate a difference signal between an audio bitstream and a feedback signal, and to perform a modulation process on the difference signal to generate an input pulse modulated signal, a class D output stage adapted to receive, quantize, and amplify the input pulse modulated signal to generate an output pulse modulated signal, and a feedback path adapted to provide the output pulse modulated signal as the feedback signal to the continuous time modulator. Another embodiment includes a class AB output stage adapted to receive and amplify an input digital audio signal to generate an analog output signal, and circuitry adapted to enable the digital audio amplifier to be configured to enable the class AB output stage and to disable the class D output stage.

20 Claims, 6 Drawing Sheets ly-competitive and lucrative market, manufacturers have had to find ways to produce high-quality audio output in an energy-efficient manner.

DIGITAL AUDIO AMPLIFIERS, ELECTRONIC SYSTEMS, AND METHODS

TECHNICAL FIELD

Embodiments relate to digital audio amplifiers, electronic systems that include digital audio amplifiers, and methods for amplifying digital audio signals.

BACKGROUND

Various types of electronic systems include digital amplifiers adapted to process and amplify digital audio signals. For example, portable media player devices, cellular telephones, radios, audio recorders, stereo equipment, and other systems may include digital amplifiers, which process and amplify voice, music, and other types of digital audio signals. During amplification, a digital amplifier may introduce non-linearity and noise into an output signal. The non-linearity and noise, referred to generally as "distortion," may be quantified in terms of signal-to-noise ratios (SNR), signal-including-noise-and-distortion (SINAD) ratios, or other quality measurements. Significant distortion, left uncompensated for, may result in poor signal quality and low end-user satisfaction.

Recently, manufacturers of portable media player devices have discovered that attention to playback time, a relatively new consumer-driven constraint, also is important to produce products that will be successful in this highly-competitive and lucrative market. "Playback time" refers to the amount of time that a portable media player may output an audio and/or video signal given a full battery charge. A device's playback time may be affected by various manufacturer-influenced factors, including battery capacity and digital amplifier power consumption and efficiency, among other things. With respect to battery capacity, technologies continue to be developed that result in batteries having higher power densities (i.e., the ratio of power available from a battery to its volume). However, the drive toward producing smaller and smaller devices also continues, thus constraining battery volumes and, accordingly, battery capacities. As manufacturers of electronic systems continue to face market pressures relating to high audio quality, smaller device sizes, and longer playback times, a need exists for digital amplifiers, electronic systems, and amplification methods, which are adapted to produce high-quality output audio signals in an energy-efficient manner.

DETAILED DESCRIPTION

Embodiments described herein include methods and apparatus for amplifying audio signals. These embodiments include a digital audio amplifier configured to compensate for some or all of the various types of distortion that may be introduced into an audio signal, including non-linearities, switching noise, and/or power supply noise. As will be explained in detail later, this is achieved by incorporating digital feedback of an output audio signal (e.g., an output pulse modulated signal) along with circuitry adapted to compensate for distortion that may be present within the output audio signal.

In various embodiments, a class D amplifier forms a portion of an electronic system. Because a class D amplifier may produce electromagnetic interference (EMI) sufficient to corrupt an audio signal, various embodiments are adapted to compensate for such EMI by enabling the electronic system to be configured to employ a class D or a class AB amplifier, as desired. With the use of a class D amplifier in accordance with various embodiments, an electronic system may operate in a more energy-efficient manner than traditional systems, thus potentially extending the playback time for certain types of electronic devices.

Figure 1:
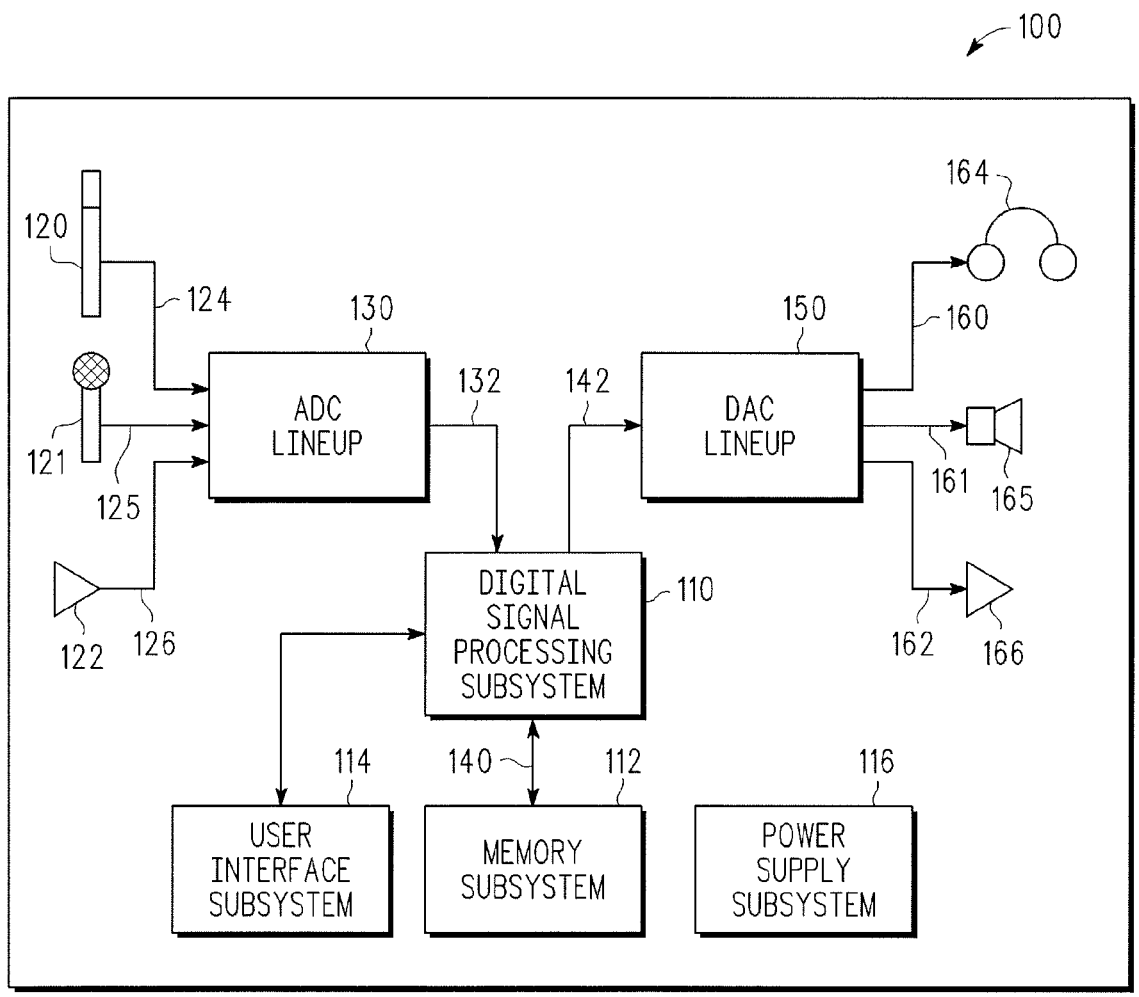
FIG. 1 illustrates a simplified block diagram of an electronic system, in accordance with an example embodiment.

FIG. 1 illustrates a simplified block diagram of an electronic system 100, in accordance with an example embodiment. Electronic system 100 may form a substantial portion of an electronic device that is adapted, at least, to amplify a digital audio signal. For example, but not by way of limitation, electronic system 100 may form a portion of a portable media player (PMP) device (e.g., a portable music player and/or portable video player), an audio recorder with playback capabilities, a television set, a computer (e.g., a laptop or desktop computer), a video player, a CD player, a DVD player, a stereo amplifier and/or tuner, a radio, a telephone (e.g., a cellular, portable, or POTS telephone), a portable gaming system, and/or other electronic systems that are adapted to amplify digital audio signals.

Electronic system 100 includes an audio input subsystem, an audio output subsystem, a digital signal processing subsystem 110, a memory subsystem 112, a user interface subsystem 114, and a power supply subsystem 116, in an embodiment. These subsystems are electrically coupled together as illustrated in FIG. 1, where the term "electrically coupled" means that electrical signals are transmissible through various interconnections between the subsystems. The interconnections between the subsystems may be direct interconnections via conductive transmission media, or may be indirect interconnections that include one or more intermediate electrical components. Although certain interconnections are illustrated in FIG. 1, it is to be understood that more, fewer or different interconnections may be present in other embodiments.

Embodiments may be particularly advantageous when used in conjunction with the audio output subsystem, which will be discussed in detail in subsequent paragraphs. However, for a contextual understanding, the other subsystems listed above will first be discussed briefly.

The audio input subsystem may include one or more audio input devices 120, 121, 122, which are adapted to produce one or more input analog audio signals 124, 125, 126. In addition, the audio input subsystem may include an analog-to-digital conversion (ADC) lineup 130, which is adapted to receive the one or more input analog audio signals 124-126, and to convert those signals into one or more digital audio signals 132. For example, but not by way of limitation, audio input devices 120-122 may include one or more radio receivers 120 (e.g., AM or FM radio receivers), one or more microphones 121, and/or one or more "line in" interfaces 122. In addition or alternately, audio input devices may include one or more wireless communication system receivers (e.g., to receive signals from terrestrial or satellite-based cellular telephone systems, television systems, and/or radio systems), one or more data ports (e.g., USB ports, wired or wireless network ports (e.g., LAN/WAN/Internet)), and/or a variety of other sources of analog audio signals. Although an electronic system 100 may include an audio input subsystem such as the one discussed herein and illustrated in FIG. 1, other electronic systems may exclude an audio input subsystem, and may receive digital audio signals from another source (e.g., memory subsystem 112).

Digital signal processing subsystem 110 is adapted to receive and process digital audio signals 132, in an embodiment, and to store the processed digital audio signals 140 in memory subsystem 112. For example, this may include performing digital filtering, data compression, and formatting, among other things. Digital signal processing subsystem 110 also or alternatively may be adapted to retrieve processed digital audio signals 140 from memory subsystem 112, and to provide the processed digital audio signals 140 in their original format or in an altered format as a digital audio signal 142 to the audio output subsystem.

User interface subsystem 114 may include one or more user interface components adapted to enable a user to input commands or other information into electronic system 100 and/or to provide visual, auditory, or mechanical indicia intended to convey information to the user. For example, but not by way of limitation, user interface subsystem 114 may include one or more display screens, touch screens, lights, speakers, vibration devices, keypads, buttons, dials, and/or other components adapted to receive input commands and/or to produce information-conveying indicia. As a particular example, user interface subsystem 114 may include one or more user interface components that enable a user to initiate download or recording of an audio signal from a remote source, and/or to initiate playback of digital audio signals that are stored within memory subsystem 112.

Memory subsystem 112 may include one or more components adapted to store digital information in a retrievable format. For example, but not by way of limitation, memory subsystem 112 may include one or more removable or non-removable, volatile or non-volatile memory components, such as ROM-based memory components, RAM-based memory components, CDs, DVDs, and/or magnetic storage media (e.g., hard disks or floppy disks), to name a few. In an embodiment, memory subsystem 112 is adapted to store digital audio information, which may be formatted in any of a variety of standard or proprietary formats, and which may be formatted with other types of information. For example, but not by way of limitation, memory subsystem 112 may be adapted to store digital audio information in the form of raw or formatted, signed or unsigned, and/or compressed or uncompressed audio data. The digital audio information may include, for example but not by way of limitation, voice recordings, music recordings, sound recordings, synthesized audio, and/or other audio data.

The audio output subsystem includes a digital-to-analog conversion (DAC) lineup 150, in an embodiment, which is adapted to receive one or more digital audio signals 142 from digital signal processing subsystem 110, and to convert those signals into one or more output audio signals 160, 161, 162. In addition, the audio output subsystem may include one or more audio output devices 164, 165, 166, which are adapted to receive and output the one or more output audio signals 160-162. For example, but not by way of limitation, audio output devices 164-166 may include one or more headsets 164 or ear speakers, one or more loudspeakers 165, and/or one or more "line out" interfaces 166. In addition or alternately, audio output devices may include one or more wireless communication system transmitters (e.g., to format and transmit signals to terrestrial or satellite-based cellular telephone systems, and/or radio systems), one or more data ports (e.g., USB ports, wired or wireless network ports (e.g., LAN/WAN/Internet)), and/or a variety of other subsystems adapted to receive analog audio signals.

As will be described in detail below, in an embodiment, DAC lineup 150 includes at least one digital audio amplifier, which may be adapted to generate the output audio signals 160-162 in the form of modulated, digital signals, such as pulse width modulated (PWM) and/or pulse density modulated (PDM) audio signals, referred to generally as "pulse modulated signals." These pulse modulated signals are used to drive the audio output devices (e.g., audio output devices 164-166, FIG. 1). As with other systems, this process of digital amplification may result in the introduction of non-linearities, switching noise, and/or other distortion into the audio signal. In addition, particularly for battery-powered systems, additional noise may be introduced due to current and/or voltage fluctuations produced by power supply subsystem 116, which may include, for example, a battery housing adapted to receive one or more rechargeable or disposable batteries.

As will be described below, a DAC lineup (e.g., DAC lineup 150) includes a digital audio amplifier configured to compensate for some or all of the various types of distortion that may be introduced into an audio signal, including non-linearities, switching noise, and/or power supply noise, according to an embodiment. This is achieved by incorporating digital feedback of an output audio signal (e.g., output pulse modulated signals 160-162) along with circuitry adapted to compensate for distortion that may be present within the output audio signal. In various embodiments, a class D amplifier forms a portion of the DAC lineup. In other embodiments, a class D amplifier and a class AB amplifier form portions of the DAC lineup, with either type of amplifier being selectable according to how the DAC lineup is configured. When a DAC lineup is configured to provide class D amplification, it may be referred to herein as being configured in a "class D mode," and when a DAC lineup is configured to provide class AB amplification, it may be referred to herein as being configured in a "class AB mode." Various embodiments are adapted to compensate for EMI produced by a class D amplifier by enabling the electronic system to be configured in a class AB mode, when desired.

In an embodiment, a class D amplifier is provided, which may receive an input digital audio signal (e.g., digital audio signal 142, FIG. 1) and generate an output audio signal (e.g., one of output audio signals 160-162, FIG. 1). Embodiments of a class D amplifier include a sigma-delta modulator (also known as a delta-sigma modulator) adapted to generate an error signal between the input digital audio signal and a feedback version of the output pulse modulated signal, a quantizer, switching circuitry, and a feedback loop adapted to provide the feedback version of the output pulse modulated signal to the sigma-delta modulator. Other embodiments of a class D amplifier include a delta modulator adapted to generate an error signal between the input digital audio signal and a feedback version of the output pulse modulated signal, a quantizer, switching circuitry, and a feedback loop adapted to provide the feedback version of the output pulse modulated signal to the delta modulator. Embodiments also include a class D amplifier provided along with a class AB amplifier, thus enabling the DAC lineup to be configured in a class D mode or a class AB mode, at any given time.

FIGS. 2-8 illustrate the various elements of class D and class AB amplifier embodiments having the elements discussed above. In particular, FIGS. 2-8 illustrate various block diagrams of a DAC lineup (e.g., DAC lineup 150, FIG. 1) that include a class D amplifier and a class AB amplifier. In the illustrated embodiments, some elements of the DAC lineup (referred to below as "shared elements") form portions of both the class D amplifier and the class AB amplifier in order to avoid duplicative circuitry, whereas other elements of the DAC lineup are used only in conjunction with a class D amplifier or a class AB amplifier, but not both. In other embodiments, a DAC lineup may include more or fewer shared elements. In addition, other embodiments may be configured differently from the illustrated embodiments while still providing the same function in substantially the same way, to produce the same result. Accordingly, such modifications are intended to be included within the scope of the inventive subject matter.

Figure 2:
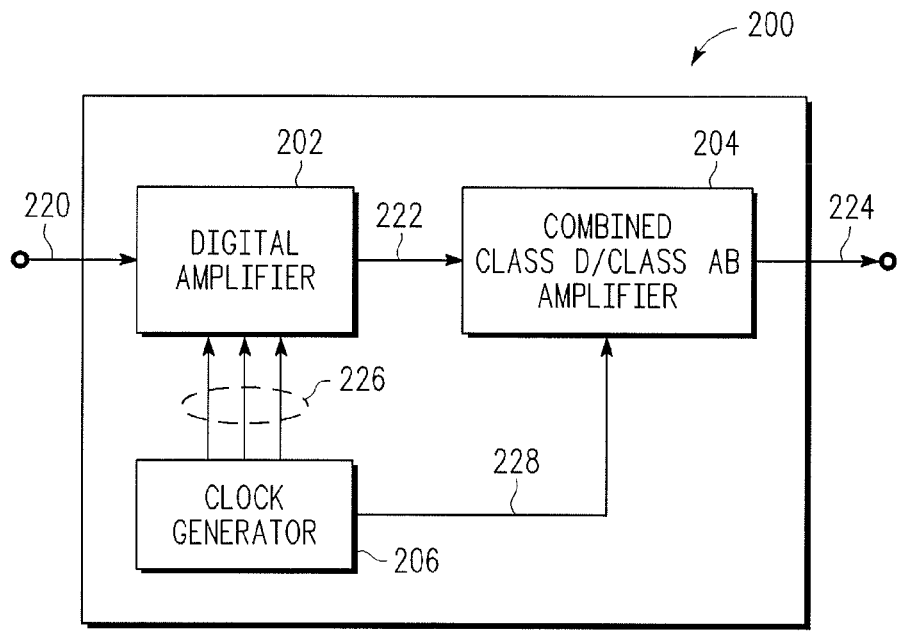
FIG. 2 illustrates a simplified block diagram of a DAC lineup, in accordance with an example embodiment.

FIG. 2 illustrates a simplified block diagram of a DAC lineup 200 (e.g., DAC lineup 150, FIG. 1), in accordance with an example embodiment. DAC lineup 200 includes a digital amplifier 202, a combined class D/class AB amplifier 204 (hereafter "class D/AB amplifier"), and a clock generator 206, in an embodiment. In an alternate embodiment, the combined class D/class AB amplifier 204 may be replaced by a class D amplifier. Although such an embodiment is not discussed in detail below, one of skill in the art would appreciate, based on the description herein, that certain elements may be modified or excluded from a design, in order to produce an embodiment in which only a class D amplifier is provided.

Digital amplifier 202 receives an input digital audio signal 220. In an embodiment, the input digital audio signal 220 may be represented as a sampled, digitized sine wave having each sample represented by a plurality of bits. For example, but not by way of limitation, each sample may be represented in a 16/18 bit format and may be received in parallel, although each sample may be represented using other formats and/or may be provided in serial, in other embodiments. Each sample may include one or more sign bits, in an embodiment, or each sample may be unsigned, in another embodiment. The input digital audio signal 220 may represent an audio signal that has been sampled at various sampling rates, including a sampling rate within the audio band (e.g., up to 25 kHz) or an "over-sampled" sampling rate. For example, but not by way of limitation, the input digital audio signal 220 may represent an audio signal that has been oversampled at 2×, 16×, 32×, 64×, or some other multiple of the audio band sampling rate. Clock generator 206 is adapted to generate clock signals 226, 228, which are provided to digital amplifier 202 and to class D/AB amplifier 204, as will be described in more detail later. The clock signals 226, 228 are generated in a manner that is consistent with the sampling, upsampling, oversampling, and/or audio bitstream rates, as will be described in more detail later.

As will be discussed in more detail later in conjunction with FIG. 3, digital amplifier 202 is adapted to filter and interpolate the input digital audio signal 220 in order to generate an audio bitstream 222. Class D/AB amplifier 204 is adapted to receive the audio bitstream 222, and to perform 1-bit amplification, resulting in the generation of an output signal 224 in the form of a pulse modulated output signal (when in a class D configuration) or an analog output signal (when in a class AB configuration). As will be discussed in more detail later in conjunction with FIG. 4, class D/AB amplifier 204 includes a loop filter, a class D output stage, and a class AB output stage. When the DAC lineup 200 is configured in a class D mode, the class D output stage is activated, and the class AB output stage is deactivated. Conversely, when the DAC lineup 200 is configured in a class AB mode, the class AB output stage is activated, and the class D output stage is deactivated.

The output signal 224 is provided to an audio output device (e.g., one of audio output devices 164-166, FIG. 1), in an embodiment. DAC lineup 200 generates the output signal 224 to have a signal power that is appropriate for the audio output device being driven. For example, but not by way of limitation, DAC lineup 200 may generate the output signal 224 to drive a relatively high power and/or relatively low power audio output device. For example, the output signal 224 may be sufficient to drive audio output devices in a range of 50 mW (e.g., for a headset or ear speaker) to 1 W (e.g., for a loudspeaker), although DAC lineup 200 may generate lower or higher power output signals 224, as well. In a particular embodiment, DAC lineup 200 may provide amplification using a class D amplifier even when driving relatively low power audio output devices (e.g., a headset or ear speaker). With a potentially higher efficiency using a class D amplifier as opposed to a class AB amplifier, this may provide an advantage of longer playback times for devices (e.g., portable media players) that typically include low power audio output devices.

Figure 3:
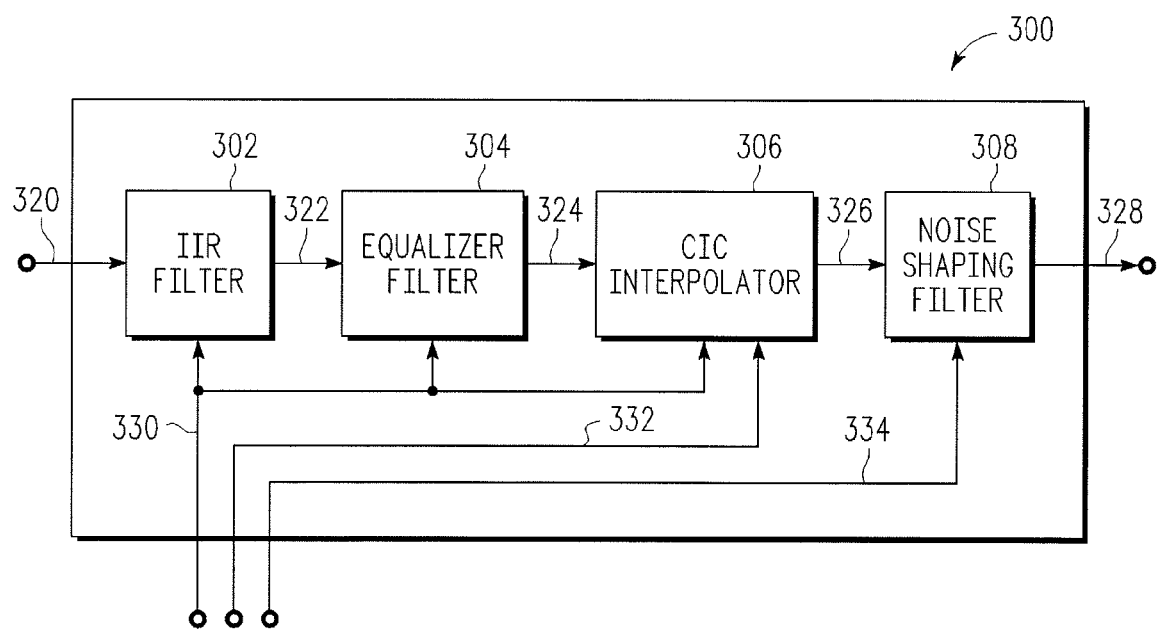
FIG. 3 illustrates a schematic diagram of a digital amplifier, in accordance with an example embodiment.

FIG. 3 illustrates a schematic diagram of a digital amplifier 300 (e.g., digital amplifier 202, FIG. 2), in accordance with an example embodiment. As mentioned previously, digital amplifier 300 is adapted to filter and interpolate an input digital audio signal 320 (e.g., input digital audio signal 220, FIG. 2) in order to generate an audio bitstream 328 (e.g., audio bitstream 222, FIG. 2). Digital amplifier 300 includes an infinite impulse response (IIR) filter 302, an equalizer filter 304, a cascaded integrator comb (CIC) interpolator 306, and a noise shaping filter 308, in an embodiment. IIR filter 302 is adapted to receive an input digital audio signal 320, and to filter and upsample the input digital audio signal 320, in order to generate an upsampled audio signal 322. In an embodiment, IIR filter 302, equalizer filter 304, and CIC interpolator 306 receive a clock signal 330 (e.g., from clock generator 206, FIG. 2), which has a frequency consistent with the sampling rate. Equalizer filter 304 is adapted to receive the upsampled audio signal 322, and to correct the phase linearity of the upsampled audio signal 332 in order to generate a phase corrected audio signal 324.

CIC interpolator 306 is adapted to receive the phase corrected audio signal 324, and to oversample the phase corrected audio signal 324 up to the frequency of noise shaping filter 308, in order to generate an oversampled audio signal 326. Accordingly, CIC interpolator 306 also receives a clock signal 332 having a frequency that is consistent with the frequency of noise shaping filter 308. Noise shaping filter 308 is adapted to receive the oversampled audio signal 326, and to convert the oversampled audio signal 326 into an audio bitstream 328. Noise shaping filter 308 receives a clock signal 334 having a frequency that is consistent with the bitrate of the audio bitstream 328.

Figure 4:
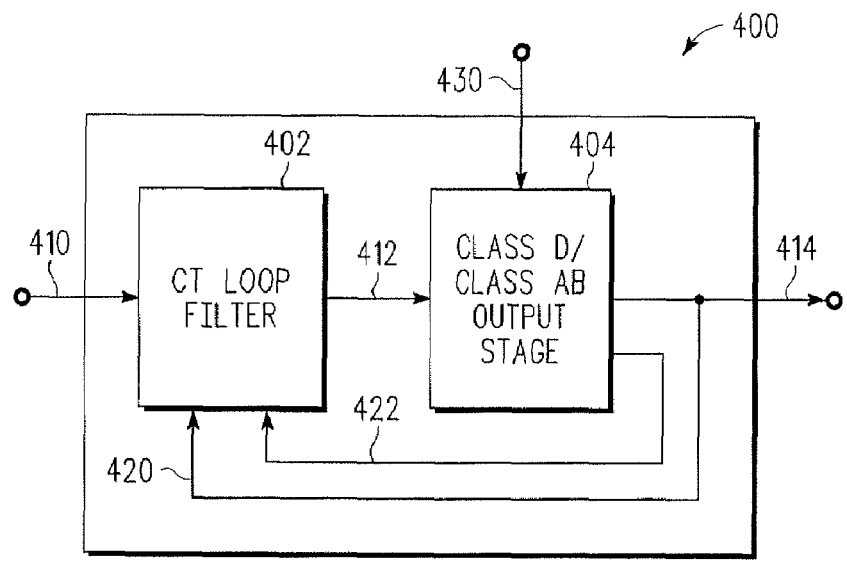
FIG. 4 illustrates a schematic diagram of a combined class D/class AB amplifier, in accordance with an example embodiment.

FIG. 4 illustrates a schematic diagram of a class D/AB amplifier 400 (e.g., combined class D/class AB amplifier 204, FIG. 2), in accordance with an example embodiment. Class D/AB amplifier 400 includes a continuous time (CT) loop filter 402 and a class D/class AB output stage 404 (referred to herein as "class D/AB output stage"), in an embodiment. As mentioned previously, class D/AB amplifier 400 is adapted to receive an audio bitstream 410 (e.g., audio bitstream 222, FIG. 2 or audio bitstream 328, FIG. 3) and to perform 1-bit amplification, resulting in the generation of an output signal 414 (e.g., output signal 224, FIG. 2) in the form of a pulse modulated signal (when in a class D configuration) or an analog signal (when in a class AB configuration).

CT loop filter 402 may include a multiple-order continuous time loop filter or continuous time modulator, in an embodiment, which is adapted to receive the audio bitstream 410 and one or more feedback signals 420, 422, and to generate a modulated digital signal 412 based on differences between the audio bitstream 410 and the feedback signals 420, 422. When the DAC lineup is configured in a class D mode, CT loop filter 402 generates a difference signal between the audio bitstream 410 and a feedback signal 420 pulled from the output signal 414 (e.g., a pulse modulated output signal), and performs a multiple-order, sigma-delta modulation on the difference signal. In an embodiment, CT loop filter 402 performs $4^{th}$ order, sigma-delta modulation using a $4^{th}$ order continuous time loop filter (CIFF) (e.g., for PDM signals), although CT loop filter may perform higher-order or lower-order modulation (e.g., as low as single order), in other embodiments. In still another embodiment, CT loop filter 402 may perform delta modulation using a multiple-order loop filter (e.g., for PWM signals). When the DAC lineup is configured in a class AB mode, CT loop filter 402 may bypass the circuitry associated with the sigma-delta or delta modulation, and may instead simply generate a difference signal between the audio bitstream 410 and a feedback signal 422 pulled from the class AB output stage. Essentially, CT loop filter 402 is adapted to measure and compensate for errors between the audio bitstream 410 and the feedback signals 420, 422. By including a CT loop filter in the DAC lineup, embodiments are adapted to operate without synchronization between the input pulse modulated signal and the feedback pulse modulated signal (e.g., the output pulse modulated signal).

Class D/AB output stage 404 is adapted to receive the modulated digital signal 412, and to generate an output signal 414 (e.g., output signal 224, FIG. 2) by performing 1-bit amplification using either a class D or a class AB output stage, depending on how the DAC lineup is configured. In an embodiment, the class D/AB output stage 404 receives a clock signal 430 (e.g., clock signal 228, FIG. 2) having a frequency that corresponds to the switching frequency of the switching circuitry of the class D/AB output stage 404.

Figure 5:
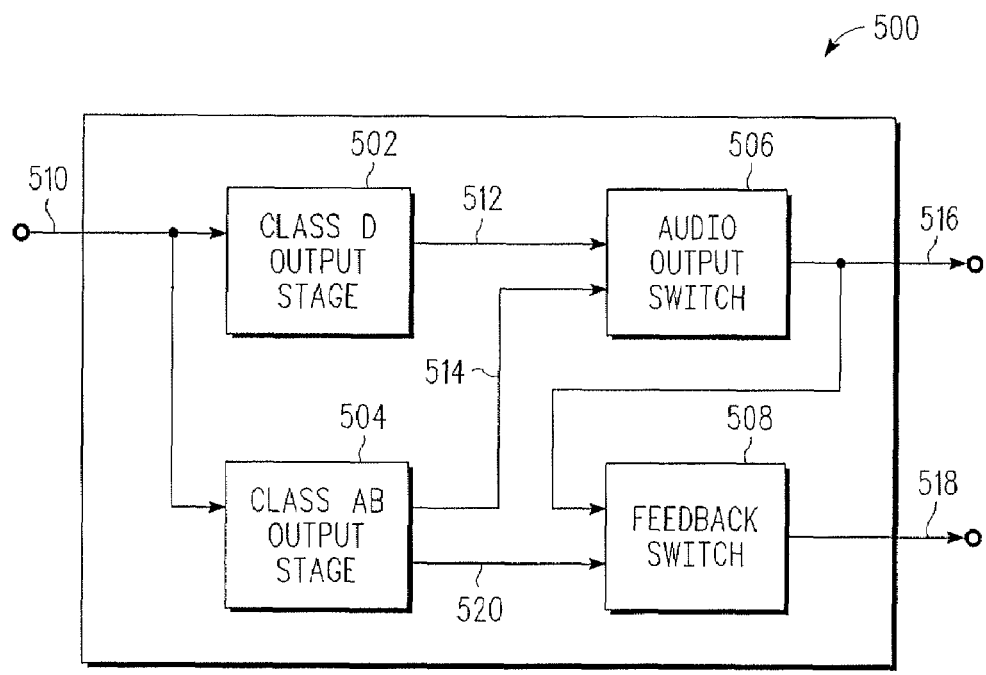
FIG. 5 illustrates a schematic diagram of a class D/class AB output stage, in accordance with an example embodiment.

FIG. 5 illustrates a schematic diagram of a class D/AB output stage 500 (e.g., class D/AB output stage 404, FIG. 4), in accordance with an example embodiment. Class D/AB output stage 500 includes a class D output stage 502, a class AB output stage 504, an audio output switch 506, and a feedback switch 508, in an embodiment. In an embodiment, both the class D output stage 502 and the class AB output stage 504 receive a clock signal 520 (e.g., clock signal 228, FIG. 2 or clock signal 430, FIG. 4) having a frequency that corresponds to the switching frequency of the switching circuitry of the class D output stage 502 and the class AB output stage 504.

As mentioned previously, the DAC lineup may be configured in a class D or class AB mode, in order to perform class D or class AB amplification, respectively. When the DAC lineup is configured in class D mode, the class D output stage 502 is activated to receive a modulated digital signal 510 (e.g., modulated digital signal 412, FIG. 4) and to generate a pulse modulated, amplified output signal 512. In addition, the class AB output stage 504 is deactivated, and the audio output switch 506 is switched to provide the pulse modulated, amplified output signal 512 as the output signal 516 (e.g., output signal 224, FIG. 2 and output signal 414, FIG. 4). Conversely, when the DAC lineup 200 is configured in class AB mode, the class AB output stage 504 is activated to receive the modulated digital signal 510 and to generate an amplified, analog output signal 514. In addition, the class D output stage 502 is deactivated, and the audio output switch 506 is switched to provide the amplified, analog output signal 514 as the output signal 516. Feedback switch 508 is switched to provide either the output signal 516 (when configured in class D mode) or the amplified, analog output signal 520 (when configured in class AB mode) as an output feedback signal 518 (e.g., feedback signal 422, FIG. 4). The configuration of the DAC lineup in class D mode or in class AB mode may be implemented via control of audio output switch 506 and feedback switch 508, in an embodiment.

Figure 6:
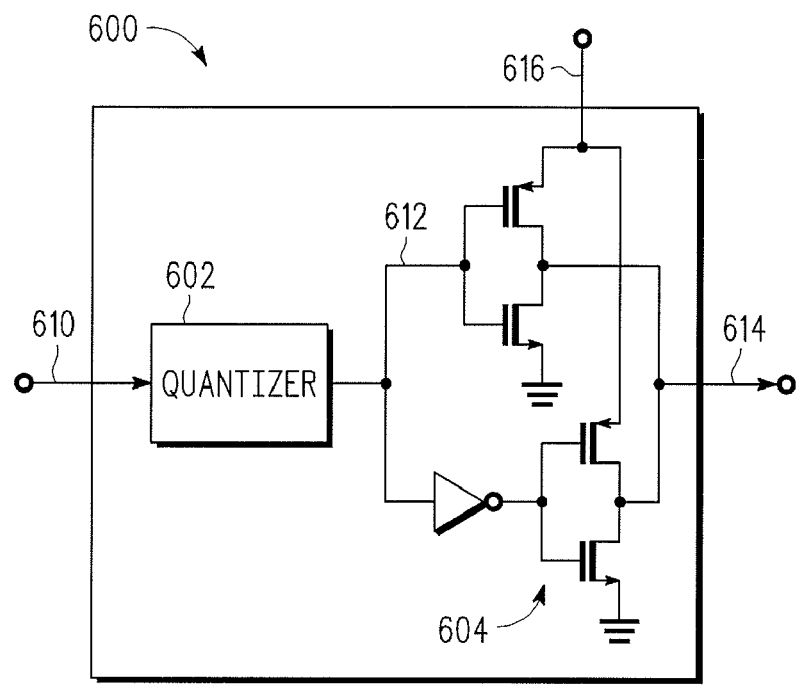
FIG. 6 illustrates a schematic diagram of a class D output stage, in accordance with an example embodiment.

FIG. 6 illustrates a schematic diagram of a class D output stage 600 (e.g., class D output stage 502, FIG. 5), in accordance with an example embodiment. As discussed in detail above, the class D output stage 600 may be activated when the DAC lineup is in class D mode. Class D output stage 600 includes a quantizer 602 and switching circuitry 604, in an embodiment. In an embodiment, quantizer 602 is a 1-bit quantizer adapted to receive a modulated digital signal 610 (e.g., modulated digital signal 412, FIG. 4 or modulated digital signal 510, FIG. 5) and to generate a quantized signal 612. Switching circuitry 604 is adapted to receive the quantized signal 612 and to generate a pulse modulated, amplified output signal 614 (e.g., pulse modulated, amplified output signal 512, FIG. 5). Switching circuitry 604 is directly or indirectly coupled to a power supply 616 (e.g., power supply subsystem 116, FIG. 1), and accordingly the pulse modulated, amplified output signal 614 may be affected by power supply noise. However, in an embodiment, the feedback configuration provided in the various embodiments may provide adequate compensation for the power supply noise, in most cases.

Figure 7:
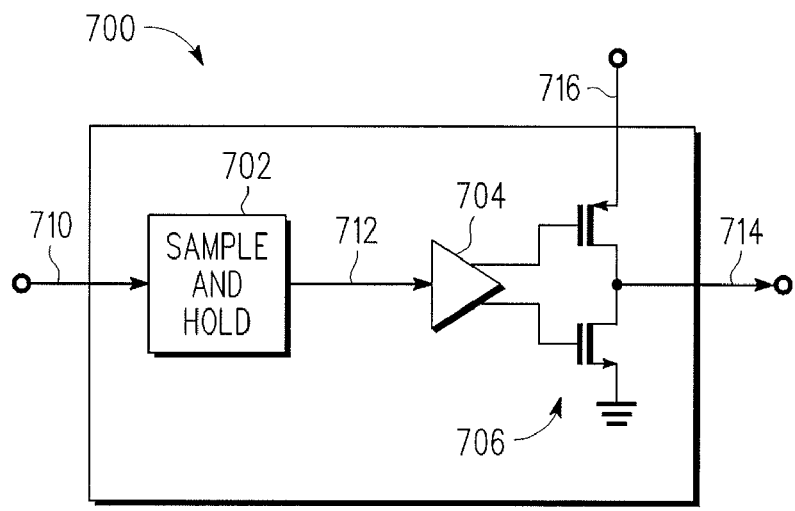
FIG. 7 illustrates a schematic diagram of a class AB output stage, in accordance with an example embodiment.

FIG. 7 illustrates a schematic diagram of a class AB output stage 700 (e.g., class AB output stage 504, FIG. 5), in accordance with an example embodiment. As discussed in detail above, the class AB output stage 700 may be activated when the DAC lineup is in class AB mode. Class AB output stage 700 includes a sample and hold circuit 702, an amplifier 704, and switching circuitry 706, in an embodiment. Sample and hold circuit 702 is adapted to receive a modulated digital signal 710 (e.g., modulated digital signal 412, FIG. 4 or modulated digital signal 510, FIG. 5), and to generate a delayed signal 712. Amplifier 704 is adapted to provide additional amplification to the delayed signal 712 prior to application of the signal to switching circuitry 706, in an embodiment. In an alternate embodiment, amplifier 704 may be excluded, thus providing a class B output stage rather than a class AB output stage. Switching circuitry 706 is adapted to receive the delayed and amplified signal 712 and to generate a further amplified, analog output signal 714 (e.g., amplified, analog output signal 514, FIG. 5). As with the case of the class D output stage, switching circuitry 706 is directly or indirectly coupled to a power supply 716 (e.g., power supply subsystem 116, FIG. 1), and accordingly the amplified, analog output signal 714 may be affected by power supply noise. However, once again, the feedback configuration provided in the various embodiments may provide adequate compensation for the power supply noise, in most cases.

Figure 8:
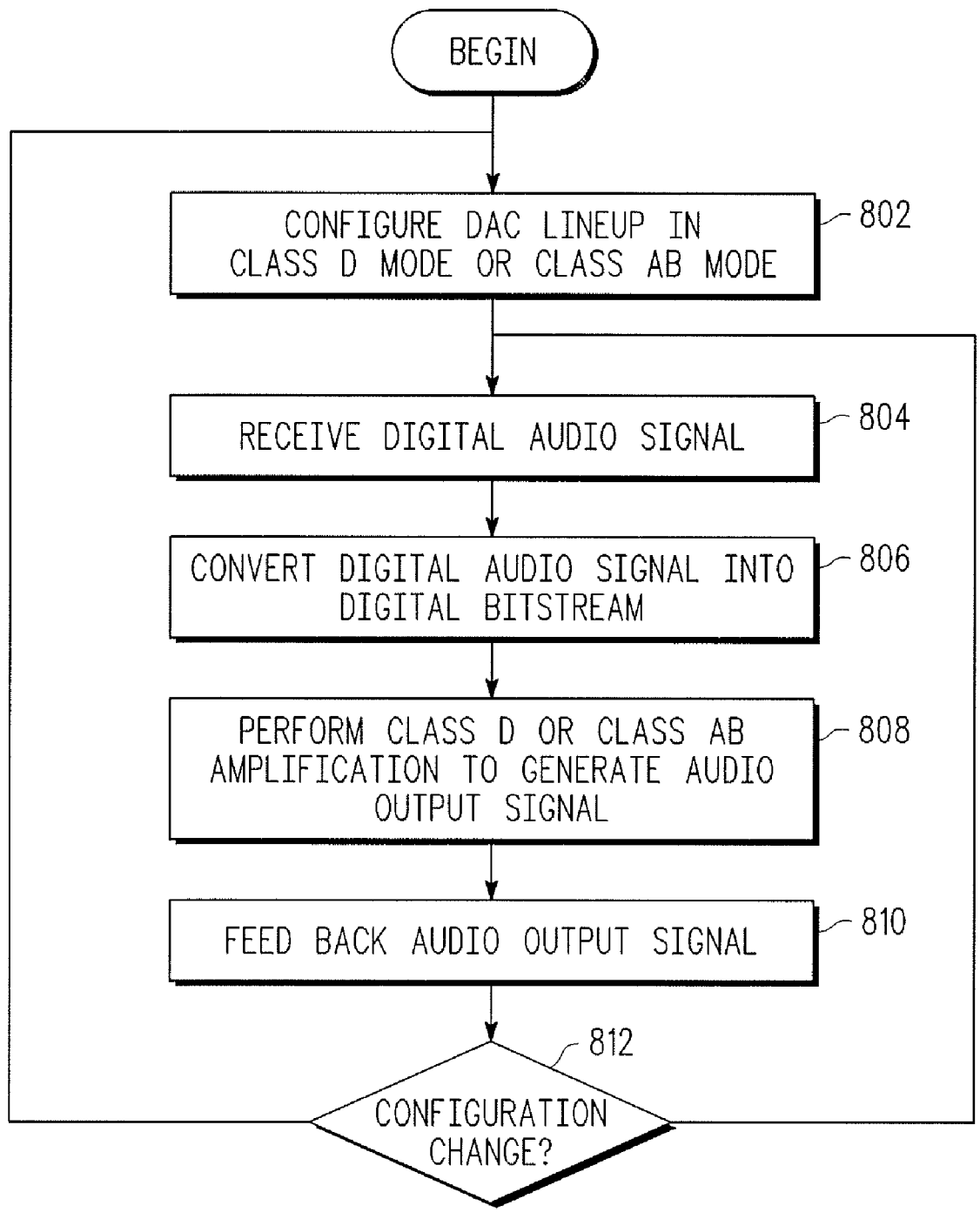
FIG. 8 illustrates a flowchart of a method for amplifying an audio signal, in accordance with an example embodiment.

FIG. 8 illustrates a flowchart of a method for amplifying an audio signal, in accordance with an example embodiment. In block 802, the DAC lineup (e.g., DAC lineup 200, FIG. 2) may configured in class D mode or in class AB mode. This configuration may be performed a single time or as needed, in an embodiment, such as when the DAC lineup is incorporated into a particular system. For example, in systems in which EMI is not a factor, the DAC lineup may be configured permanently into class D mode. In systems in which EMI always may be a factor, the DAC lineup may be configured permanently into class AB mode. In systems in which EMI sometimes may be a factor (e.g., in a cellular telephone or other system in which EMI may affect signals transmitted by the system), the DAC lineup may be configured temporarily into class D mode or class AB mode. For example, the DAC lineup may be configured into class D mode when EMI-affected system elements are not operable (e.g., the cellular telephone transceiver is not operable), and may be configured into class AB mode when the EMI-affected system elements are operable. At times when EMI may not be a factor, the DAC lineup may be configured into class D mode to provide various advantages associated with that mode. At times when EMI may be a factor, the DAC lineup may be configured into class AB mode to provide the other advantages associated with that mode. Although EMI is used as an example variable affecting the configuration of the DAC lineup into class D mode or class AB mode, other factors may influence a system decision to configure the DAC lineup into class D mode or class AB mode.

In block 804, the DAC lineup may receive a digital audio signal (e.g., digital audio signal 142, FIG. 1). As described above, the digital audio signal may be received in the form of digital audio samples. In block 806, the digital audio signal may be converted into a digital bitstream, and 1-bit class D or class AB amplification may be performed on the digital bitstream, in block 808, to generate an output audio signal. In block 810, the output audio signal may be fed back to the DAC lineup to provide for compensation for various types of distortion that may be present in the output audio signal, as described in detail above. In block 812, a determination may be made whether a configuration change has occurred (e.g., a change from class D mode to class AB mode, or vice versa). If so, then the DAC lineup is reconfigured in block 802, and the method iterates as shown. If not, then the DAC lineup continues to operate in the current mode, and the method iterates as shown.

It is to be understood that certain ones of the process blocks depicted in FIG. 8 may be performed in parallel with each other. In addition, it is to be understood that the particular ordering of the process blocks depicted in FIG. 8 may be modified, while achieving substantially the same result. Accordingly, such modifications are intended to be included within the scope of the inventive subject matter.

As may be gleaned from the description, above, embodiments may provide one or more advantages over traditional systems. For example, a potential advantage of various embodiments is that, with the use of a class D amplifier, some electronic system may operate with higher efficiency than traditional systems, thus potentially extending the playback time for certain types of electronic devices (e.g., portable media players). The primary reason for this is that a class D amplifier typically operates in the linear region of a transistor curve, whereas a class AB amplifier typically operates in the saturation region of transistor curve, as is explained more clearly in conjunction with FIG. 9.

Figure 9:
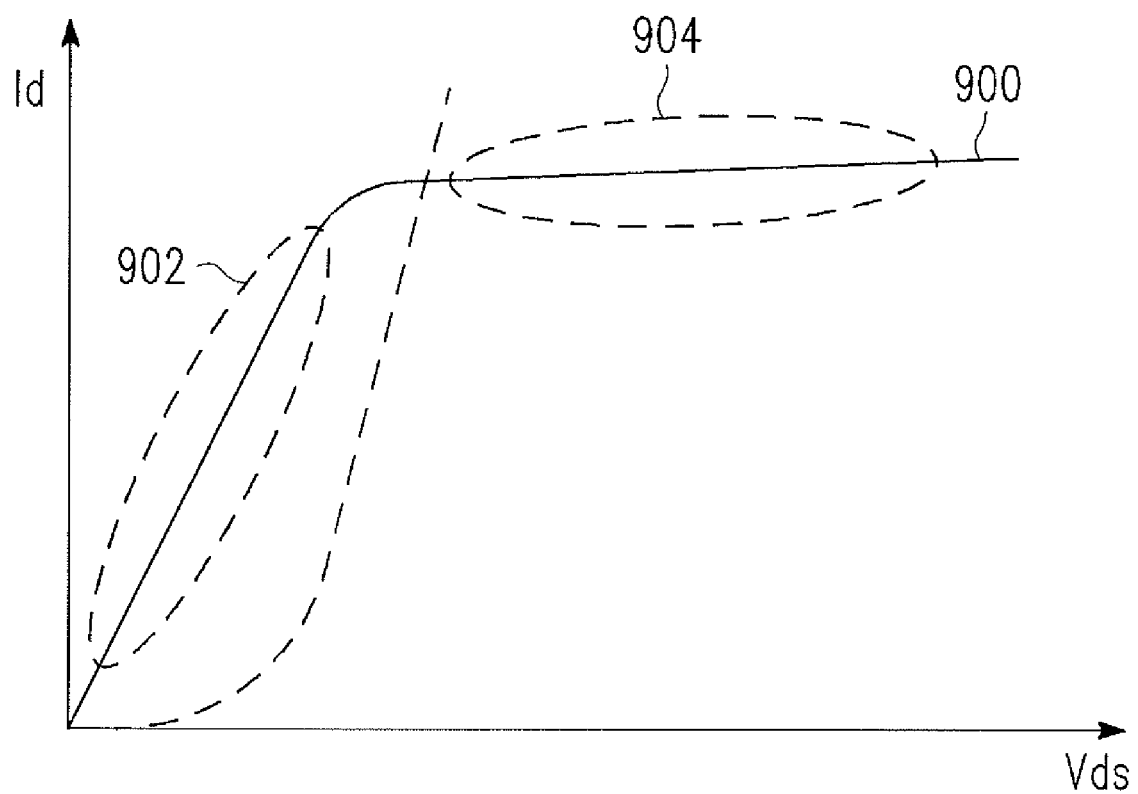
FIG. 9 illustrates a plot of transistor current, Id, versus voltage, Vds, in accordance with an example embodiment.

FIG. 9 illustrates a plot 900 of current, Id, in the channel region of a transistor against the potential difference, Vds, across the channel for a given applied gate current. The illustrated plot may pertain, for example, to a MOS transistor (e.g., CMOS, bi-CMOS), although analogous representations of current versus potential may be made for other types of transistors.

Plot 900 includes a linear region 902 and a saturation region 904. Typically, a class D amplifier operates in the linear region 902, whereas a class AB amplifier operates in the saturation region 904. Accordingly, a class D amplifier may have higher efficiency (e.g., up to a theoretical maximum of 100%) than the efficiency of a class AB amplifier (e.g., up to a maximum of about 78%). This may translate to lower power dissipation for a class D amplifier, when compared to a class AB amplifier. In addition, the size of a power MOS device used in conjunction with a class D amplifier may be smaller than that used in conjunction with a class AB amplifier, because a power MOS device for a class D amplifier is sized with respect to the turn-on resistance, Ron, rather than the saturation voltage, as is the case with a power MOS incorporated into a class AB amplifier.

As may be gleaned from the description, above, embodiments may provide one or more advantages over traditional systems. For example, embodiments are adapted to operate with either or both PWM and PDM signals, meaning that the feedback and distortion compensation may be performed by the digital audio amplifier regardless of the type of the input pulse modulated signal. In addition, by including a continuous time modulator in the digital audio amplifier, embodiments are adapted to operate without synchronization between the input pulse modulated signal and the feedback pulse modulated signal (e.g., the output pulse modulated signal), and the feedback and distortion compensation may be performed regardless of the switching frequency. Another potential advantage is that embodiments may operate effectively without some of the hardware that is used in traditional systems, such as stereo DACs (S DACs) and EMI filters, for example. Still another potential advantage is that embodiments are configurable to provide high efficiency amplification (e.g., using a class D amplifier) or using low-EMI emitting amplification (e.g., using a class AB amplifier), as desired.

Thus, various embodiments of digital audio amplifiers, electronic systems, and methods of their operation have been described. An embodiment of an electronic system having a digital audio amplifier includes a continuous time modulator adapted to generate a difference signal between an audio bitstream and a feedback signal, and to perform a modulation process on the difference signal to generate an input pulse modulated signal, a class D output stage adapted to receive, quantize, and amplify the input pulse modulated signal to generate an output pulse modulated signal, and a feedback path, electrically coupled between the class D output stage and the continuous time modulator, and adapted to provide the output pulse modulated signal as the feedback signal to the continuous time modulator.

Another embodiment of a digital audio amplifier includes a class D output stage adapted to receive, quantize, and amplify an input pulse modulated signal to generate an output pulse modulated signal for driving an audio output device, a class AB output stage adapted to receive and amplify an input digital audio signal to generate an analog output signal for driving the audio output device, and circuitry adapted to enable the digital amplifier to be configured in a class D mode or in a class AB mode, where in the class D mode, the class D output stage is enabled and the class AB output stage is disabled, and where in the class AB mode, the class D output stage is disabled and the class AB output stage is enabled.

An embodiment of a method for amplifying an audio signal includes receiving a digital audio signal, converting the digital audio signal into an audio bitstream, performing class D amplification of the digital bitstream to generate an output pulse modulated signal, wherein performing the class D amplification includes generating a difference signal between the audio bitstream and a feedback version of the output pulse modulated signal and performing a multiple-order modulation process on the difference signal using a continuous time modulator, and driving an audio output device with the output pulse modulated signal.

While the principles of the various embodiments have been described above in connection with specific systems, apparatus, and methods, it is to be clearly understood that this description is made only by way of example and not as a limitation on the scope of the inventive subject matter. Further, the phraseology or terminology employed herein is for the purpose of description and not of limitation.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. An electronic system that includes a digital audio amplifier comprising:
   a continuous time modulator adapted to generate a difference signal between an audio bitstream and a feedback signal, and to perform a modulation process on the difference signal to generate an input pulse modulated signal;
   a class D output stage adapted to receive, quantize, and amplify the input pulse modulated signal to generate an output pulse modulated signal;
   an additional output stage selected from a group of output stages consisting of a class B output stage and a class AB output stage, wherein the additional output stage is adapted to receive the input pulse modulated signal and to generate an analog output signal; and
   a feedback path, electrically coupled between the class D output stage and the continuous time modulator and between the additional output stage and the continuous time modulator, and adapted to provide the output pulse modulated signal or the analog output signal as the feedback signal to the continuous time modulator.

2. The electronic system of claim 1, wherein the continuous time modulator includes a sigma-delta modulator adapted to generate the input pulse modulated signal as a pulse density modulated digital signal.

3. The electronic system of claim 1, wherein the continuous time modulator includes a delta modulator adapted to generate the input pulse modulated signal as a pulse width modulated digital signal.

4. The electronic system of claim 1, wherein the digital audio amplifier is adapted to generate the output pulse modulated signal having a power level adapted to drive a headset or an ear speaker.

5. The electronic system of claim 1, further comprising:
   an interpolator adapted to receive a digital audio signal, and to generate the audio bitstream from the digital audio signal.

6. The electronic system of claim 5, wherein the input audio signal has a 16/18 bit format.

7. The electronic system of claim 1, wherein electronic system forms a portion of a portable media player.

8. The electronic system of claim 1, wherein electronic system forms a portion of a cellular telephone.

9. An electronic system that includes a digital audio amplifier comprising:
   a continuous time modulator adapted to generate a difference signal between an audio bitstream and a feedback signal, and to perform a modulation process on the difference signal to generate an input pulse modulated signal;
   a class D output stage adapted to receive, quantize, and amplify the input pulse modulated signal to generate an output pulse modulated signal;
   a class AB output stage adapted to receive and amplify an input digital audio signal to generate an analog output signal;
   a feedback path, electrically coupled between the class D output stage and the continuous time modulator, and adapted to provide the output pulse modulated signal or the analog output signal as the feedback signal to the continuous time modulator; and
   circuitry adapted to enable the digital audio amplifier to be configured to enable the class AB output stage and to disable the class D output stage.

10. An electronic system comprising:
    an audio input subsystem adapted to receive and digitize an analog audio signal to produce a digital audio signal;
    an audio output subsystem adapted to receive the digital audio signal and to generate an output audio signal from the digital audio signal, wherein the audio output subsystem includes
        a digital audio amplifier adapted to receive the digital audio signal and to generate an audio bitstream,
        a continuous time modulator adapted to generate a difference signal between the audio bitstream and a feedback signal, and to perform a modulation process on the difference signal to generate an input pulse modulated signal, and
        a class D output stage adapted to receive, quantize, and amplify the input pulse modulated signal to generate the output audio signal as an output pulse modulated signal;
    a feedback path, electrically coupled between the class D output stage and the continuous time modulator, and adapted to provide the output pulse modulated signal as the feedback signal to the continuous time modulator; and
    at least one audio output device coupled to the audio output subsystem.

11. The electronic system of claim 10, wherein the audio output subsystem further comprises:
    a class AB output stage adapted to receive and amplify an input digital audio signal to generate an analog output signal; and
    circuitry adapted to enable the digital audio amplifier to be configured to enable the class AB output stage and to disable the class D output stage.

12. The electronic system of claim 10, wherein the at least one audio output device includes a headphone.

13. The electronic system of claim 10, wherein the at least one audio output device includes an ear speaker.

14. A digital audio amplifier comprising:
    a class D output stage adapted to receive, quantize, and amplify an input pulse modulated signal to generate an output pulse modulated signal for driving an audio output device;
    a class AB output stage adapted to receive and amplify an input digital audio signal to generate an analog output signal for driving the audio output device; and circuitry adapted to enable the digital amplifier to be configured in a class D mode or in a class AB mode, wherein in the class D mode, the class D output stage is enabled and the class AB output stage is disabled, and wherein in the class AB mode, the class D output stage is disabled and the class AB output stage is enabled.

15. The digital audio amplifier of claim 14, further comprising:
a sigma-delta modulator adapted to generate the input pulse modulated signal as a pulse density modulated digital signal.

16. The digital audio amplifier of claim 14, further comprising:
a delta modulator adapted to generate the input pulse modulated signal as a pulse width modulated digital signal.

17. The digital audio amplifier of claim 14, further comprising:
a continuous time modulator adapted to generate a difference signal between an audio bitstream and a feedback signal, and to perform a modulation process on the difference signal to generate the input pulse modulated signal; and
a feedback path, electrically coupled between the class D output stage and the continuous time modulator, and adapted to provide the output pulse modulated signal as the feedback signal to the continuous time modulator.

18. A method for amplifying an audio signal by an electronic system, the method comprising the steps of:
receiving a digital audio signal;
converting the digital audio signal into an audio bitstream;
when the electronic system is configured in a class D mode, performing class D amplification of the digital bitstream to generate an output pulse modulated signal based on a difference signal between the audio bitstream and a feedback version of the output pulse modulated signal;
when the electronic system is configured in a class AB mode, performing class AB amplification of the digital bitstream to generate an amplified, analog output signal based on a difference signal between the audio bitstream and a feedback version of the amplified, analog output signal; and
driving an audio output device with the output pulse modulated signal when the electronic system is configured in the class D mode or with the analog output signal when the electronic system is configured in the class AB mode.

19. The method of claim 18, further comprising:
configuring the electronic system in the class D mode or in the class AB mode.

20. A method for amplifying an audio signal by an electronic system, the method comprising the steps of:
receiving a digital audio signal;
converting the digital audio signal into an audio bitstream;
configuring the electronic system in a class D mode or in a class AB mode;
when the electronic system is configured in the class D mode, performing class D amplification of the digital bitstream to generate an output pulse modulated signal, wherein performing the class D amplification includes generating a difference signal between the audio bitstream and a feedback version of the output pulse modulated signal and performing a modulation process on the difference signal using a continuous time modulator;
driving an audio output device with the output pulse modulated signal; and
performing class AB amplification on the digital audio signal when the electronic system is configured in the class AB mode.

* * * * *